United States Patent
Li et al.

(10) Patent No.: US 11,183,610 B2
(45) Date of Patent: Nov. 23, 2021

(54) PHOTOELECTRIC DETECTOR, PREPARATION METHOD THEREOF, DISPLAY PANEL AND DISPLAY DEVICE

(71) Applicant: BOE Technology Group Co., Ltd., Beijing (CN)

(72) Inventors: Chao Li, Beijing (CN); Jianhua Du, Beijing (CN); Feng Guan, Beijing (CN); Yupeng Gao, Beijing (CN); Zhaohui Qiang, Beijing (CN); Zhi Wang, Beijing (CN); Yang Lyu, Beijing (CN); Chao Luo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/909,526

(22) Filed: Jun. 23, 2020

(65) Prior Publication Data

US 2021/0005769 A1    Jan. 7, 2021

(30) Foreign Application Priority Data

Jul. 2, 2019 (CN) .......................... 201910591338.1

(51) Int. Cl.
*H01L 31/105* (2006.01)
*H01L 27/12* (2006.01)
(Continued)

(52) U.S. Cl.
CPC ........ *H01L 31/105* (2013.01); *H01L 27/1214* (2013.01); *H01L 31/12* (2013.01); *H01L 31/18* (2013.01)

(58) Field of Classification Search
CPC ....... H01L 31/105; H01L 31/12; H01L 31/18; H01L 31/035272; H01L 27/1214; H01L 27/1443; H01L 27/142
See application file for complete search history.

(56) References Cited

U.S. PATENT DOCUMENTS

2002/0081766 A1    6/2002   Iriguchi
2003/0122210 A1*   7/2003   Cohen .................. H01L 31/105
                                                    257/465
(Continued)

FOREIGN PATENT DOCUMENTS

CN    106910796 A    6/2017
CN    109727974 A    5/2019
JP    2002151702 A   5/2002

OTHER PUBLICATIONS

Office Action Action for corresponding Chinese Application No. 201910591338.1 dated Aug. 18, 2020.

*Primary Examiner* — Sitaramarao S Yechuri
(74) *Attorney, Agent, or Firm* — Arent Fox LLP; Michael Fainberg

(57) ABSTRACT

The present disclosure discloses a photoelectric detector, a preparation method thereof, a display panel and a display device. The photoelectric detector includes a base, and a thin film transistor (TFT) and a photosensitive PIN device on the base, wherein the PIN device includes an I-type region that does not overlap with an orthographic projection of the TFT on the base; a first etching barrier layer covering a top surface of the I-type region; a first heavily doped region in contact with a side surface on a side, proximate to the TFT, of the I-type region; and a second heavily doped region in contact with a side surface on a side, away from the TFT, of the I-type region, the doping types of the first heavily doped region and the second heavily doped region being different from each other.

15 Claims, 4 Drawing Sheets

(51) Int. Cl.
    *H01L 31/12*      (2006.01)
    *H01L 31/18*      (2006.01)

(56)          References Cited

U.S. PATENT DOCUMENTS

2011/0165727 A1* 7/2011   Weng ................... H01L 31/153
                                                           438/98
2011/0241006 A1* 10/2011  Mitani .............. H01L 29/78633
                                                           257/59
2014/0051200 A1*  2/2014  Lin ........................ G06F 3/042
                                                           438/59
2014/0252314 A1   9/2014  Yu et al.
2016/0343780 A1* 11/2016  Guo ...................... H01L 27/142
2018/0254301 A1   9/2018  Zhao
2019/0019899 A1*  1/2019  Wang ............... H01L 31/02327

* cited by examiner

PHOTOELECTRIC DETECTOR, PREPARATION METHOD THEREOF, DISPLAY PANEL AND DISPLAY DEVICE

CROSS-REFERENCE TO RELATED APPLICATIONS

This application claims priority to Chinese Patent Application No. 201910591338.1, filed on Jul. 2, 2019, which is hereby incorporated by reference in its entirety.

FIELD

The present disclosure relates to the field of display technologies, and in particular, relates to a photoelectric detector, a preparation method thereof, a display panel and a display device.

BACKGROUND

At present, the combination of optical sensing elements and displays to achieve optical sensing, human-computer interaction, biometrics and the like has become one of research hotspots. A structure of an existing PIN photodiode with the TFT integrated in is generally very complex and has many film layers, and the overall thickness of the film layers is large, so that the transmittance and transmission efficiency of optical signals are reduced, and the photo-response sensitivity is affected.

SUMMARY

The present disclosure discloses a photoelectric detector, a preparation method thereof, a display panel and a display device. In the photoelectric detector, a PIN device is of a horizontal structure, and a first heavily doped region and a second heavily doped region of the PIN device are respectively on two opposite sides of the periphery of an I-type region of the PIN device.

The present disclosure provides the following technical solution.

A photoelectric detector includes a base, and a thin film transistor (TFT) on the base, and a photosensitive PIN device on the base, wherein the PIN device includes:

an I-type region, wherein an orthographic projection, on the base, of the I-type region does not overlap with an orthographic projection, on the base, of the TFT;

a first etching barrier layer, covering a top surface of the I-type region;

a first heavily doped region, in contact with a side surface on a side, proximate to the TFT, of the I-type region;

a second heavily doped region, in contact with a side surface on a side, away from the TFT, of the I-type region; wherein a doping type of the first heavily doped region is different from a doping type of the second heavily doped region;

a first electrode, covering a top surface of the first heavily doped region; wherein the first electrode is electrically connected to a drain of the TFT; and a second electrode, covering a top surface of the second heavily doped region; wherein the second electrode is electrically connected to an electrode lead wire.

Optionally, the PIN device further includes a second etching barrier layer covering a top surface of the second electrode; wherein the electrode lead wire is electrically connected to the second electrode through a first via hole that runs through the second etching barrier layer.

Optionally, the PIN device further includes a third etching barrier layer, covering a top surface of the first electrode; wherein a connecting wire electrically connected with the drain of the TFT is electrically connected to the first electrode through a second via hole that runs through the third etching barrier layer.

Optionally, the electrode lead wire, the connecting wire, a source of the TFT, and the drain of the TFT are in a same layer and made of a same material.

Optionally, the TFT further includes a buffer layer, an active layer, a gate insulating layer, a gate, an interlayer dielectric layer, the source and the drain that are successively stacked on the base; wherein the source is electrically connected to a heavily doped region at one end of the active layer through a third via hole that runs through the interlayer dielectric layer and the gate insulating layer, and the drain is electrically connected to a heavily doped region at the other end of the active layer through a fourth via hole that runs through the interlayer dielectric layer and the gate insulating layer.

Optionally, the doping type of the first heavily doped region and a doping type of heavily doped regions of the active layer of the TFT are same.

Optionally, the first heavily doped region and the first electrode extend to an area where the TFT is located to serve as the drain of the TFT.

Optionally, the electrode lead wire includes a first lead wire portion in a same layer as the first heavily doped region and in contact with the second electrode through the first via hole, and a second lead wire portion on the first lead wire portion and in a same layer as the first electrode.

The present disclosure further provides a display panel, including a display substrate and any photoelectric detector provided by the above technical solution, wherein a base in the display substrate and the base in the photoelectric detector are a same base.

The present disclosure further provides a display device, including any display panel provided by the above technical solution.

Based on the same inventive concept, the present disclosure further provides a preparation method of a photoelectric detector, including:

forming a buffer layer, an active layer, a gate insulating layer and a gate successively on the base;

performing ion implantation for heavy doping on the active layer to form a heavily doped region;

forming an interlayer dielectric layer on the gate;

forming an a-Si layer and a first etching barrier film successively on the interlayer dielectric layer;

patterning the a-Si layer and the first etching barrier film by a same patterning process to form the I-type region and the first etching barrier layer covering the top surface of the I-type region;

forming a second heavily doped layer, a second electrode layer and a second etching barrier film successively on the first etching barrier layer;

patterning the second heavily doped layer, the second electrode layer and the second etching barrier film by a same patterning process to form the second heavily doped region, the second electrode and a second etching barrier layer stacked successively on the side, away from the TFT, of the I-type region;

forming a first heavily doped layer and a first electrode layer successively on the second etching barrier layer;

patterning the first heavily doped layer and the first electrode layer by a same patterning process to form the first heavily doped region and the first electrode stacked successively on the side, proximate to the TFT, of the I-type region; and forming a source, and the drain electrically connected to the first electrode on the interlayer dielectric layer, and forming the electrode lead wire electrically connected to the second electrode on the second etching barrier layer while forming the source and the drain.

Optionally, the preparation method further includes:

forming a third etching barrier film on the first electrode layer; and patterning the first heavily doped layer, the first electrode layer and the third etching barrier film by a same patterning process to form the first heavily doped region, the first electrode and the third etching barrier layer stacked successively on the side, proximate to the TFT, of the I-type region.

Optionally, the preparation method further includes: patterning the second etching barrier layer, the third etching barrier layer, the interlayer dielectric layer and the gate insulating layer by a same patterning process to form a first via hole running through the second etching barrier layer, a second via hole running through the third etching barrier layer, and a third via hole and a fourth via hole running through the interlayer dielectric layer and the gate insulating layer, before forming the source, and the drain electrically connected to the first electrode on the interlayer dielectric layer.

Optionally, the preparation method further includes: patterning the second etching barrier layer, the interlayer dielectric layer and the gate insulating layer by a same patterning process to form a first via hole running through the second etching barrier layer, and a third via hole and a fourth via hole running through the interlayer dielectric layer and the gate insulating layer, before forming a first heavily doped layer and a first electrode layer successively on the second etching barrier layer.

Optionally, the forming the source, and the drain electrically connected to the first electrode on the interlayer dielectric layer, and forming an electrode lead wire electrically connected to the second electrode on the second etching barrier layer while forming the source and the drain includes:

patterning the first heavily doped layer and the first electrode layer by a same patterning process to form the first heavily doped region and the first electrode stacked successively on the side, proximate to the TFT, of the I-type region; and forming the electrode lead wire at the first via hole, forming the source at the third via hole, and forming the drain at the fourth via hole, while patterning the first heavily doped layer and the first electrode layer.

REFERENCE SIGNS

1—base; 2—buffer layer; 3—active layer; 4—gate insulating layer; 5—gate; 6—interlayer dielectric layer; 7—source; 8—drain; 9—I-type region; 10—first etching barrier layer; 11—second heavily doped region; 12—second electrode; 13—second etching barrier layer; 14—first heavily doped region; 15—first electrode; 16—third etching barrier layer; 17—connecting wire; 18—electrode lead wire; 19—protective layer; 20—planarization layer; 21—first via hole; 22—second via hole; 23—third via hole; 24—fourth via hole.

DETAILED DESCRIPTION OF THE EMBODIMENTS

The technical solutions in the embodiments of the present disclosure will be described below clearly and completely in conjunction with the accompanying drawings in the embodiments of the present disclosure. Obviously, the described embodiments are only a part of the embodiments of the present disclosure, and not all the embodiments. All other embodiments obtained by those of ordinary skill in the art without creative work, based on the embodiments in the present disclosure, fall into the protection scope of the present disclosure.

Figure 9:
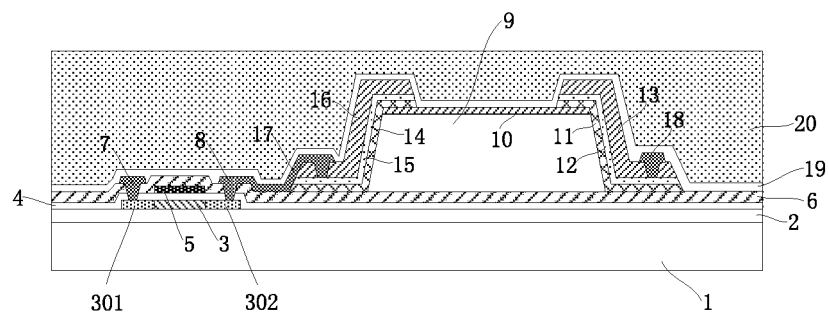
Figure 12:
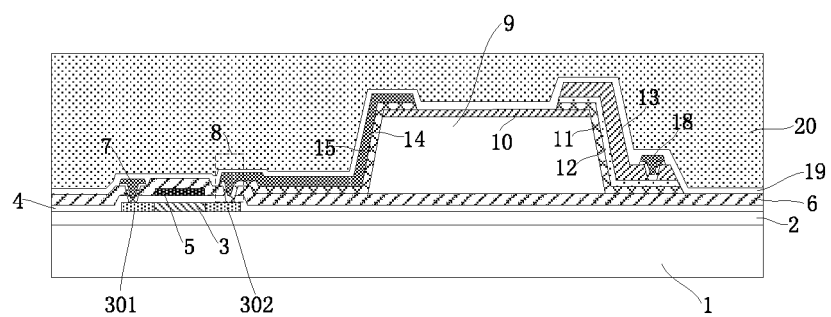

As shown in FIG. 9 or FIG. 12, embodiments of the present disclosure provides a photoelectric detector, including: a base 1, a thin film transistor (TFT) on the base 1, and a photosensitive PIN device on the base 1. The PIN device includes: an I-type region 9 wherein an orthographic projection, on the base, of the I-type region does not overlap with an orthographic projection, on the base 1, of the TFT; a first etching barrier layer 10 covering a top surface of the I-type region 9; a first heavily doped region 14 in contact with a side surface on a side, proximate to the TFT, of the I-type region 9; a second heavily doped region 11 in contact with a side surface on a side, away from the TFT, of the I-type region 9, wherein the doping type of the first heavily doped region 14 and the doping type of the second heavily doped region 11 are different from each other; a first electrode 15 covering a top surface of the first heavily doped region 14, wherein the first electrode 15 is electrically connected to a drain 8 of the TFT; and a second electrode 12 covering a top surface of the second heavily doped region 11, wherein the second electrode 12 is electrically connected to an electrode lead wire 18.

The above-mentioned photoelectric detector includes the TFT and the photosensitive PIN device electrically connected to the TFT, which are on a base. For convenience of description, a direction perpendicular to the base is defined as a vertical direction, and a direction parallel to the base and on the paper is defined as a horizontal direction (or transverse direction). The PIN device in the present disclosure includes the I-type region, and the orthographic projection, on the base, of the I-type region and the orthographic projection, on the base, of the TFT do not overlap each other. That is, the I-type region and the TFT do not overlap in the vertical direction. The first heavily doped region is on the side, proximate to the TFT, of the I-type region, and the first heavily doped region is in contact connection with the side surface on the side, proximate to the TFT, of the I-type region. An upper surface of the first heavily doped region is covered with the first electrode with the same pattern as the first heavily doped region, and the first electrode is electrically connected to a drain of the TFT. The second heavily doped region is on a side, away from the TFT, of the I-type region, and the second heavily doped region is in contact connection with a side surface on a side, away from the TFT, of the I-type region. An upper surface of the second heavily doped region is covered with the second electrode with the same pattern as the second heavily doped region, and the second electrode is electrically connected to the electrode lead wire. The above-mentioned first heavily doped region may be a P-type region or an N-type region, and the second heavily doped region may also be a P-type region or an N-type region. As the doping types of the first heavily doped region and the second heavily doped region are different, the types of the first heavily doped region and the second heavily doped region may be set as follows: the first heavily doped region is a P-type region and the second heavily doped region is an N-type region, or the first heavily doped region is an N-type region and the second heavily doped region is a P-type region. According to the structure of the PIN device described above, two connecting ends of the PIN device are respectively along the transverse direction, i.e. the two connecting ends are on two opposite sides of the I-type region to form a horizontal PIN structure, so that the number and thickness of film layers on a light incident side of the PIN device are reduced, thereby reducing the reflection and absorption of optical signals by the film layers, increasing the transmittance of the optical signals, and being beneficial to improving the responsivity of the device. Furthermore, as the above-mentioned PIN device has a horizontal structure, an optical signal from the top directly reaches the I-type region without passing through the first heavily doped region layer or the second heavily doped region, so that the optical signal can be used more fully to generate photo-generated carriers, and the responsivity of the device is improved. Moreover, the first etching barrier layer is on the top surface of the I-type region. In a preparation process, the first etching barrier layer may be prepared in the same patterning process as the I-type region. The first etching barrier layer may protect the I-type region in the preparation process, so that a large sidewall leakage current due to the influence of photolithography, etching, and other processes, such as ion residue, and organic contamination, is avoided.

In the above-mentioned photoelectric detector, the PIN device is of the horizontal structure, and the first heavily doped region and the second heavily doped region are respectively on two opposite sides of the periphery of the I-type region, so that the number and thickness of film layers on a light incident side of the PIN device are effectively reduced, thereby reducing the reflection and absorption of optical signals by the film layers, increasing the transmittance of the optical signals, and improving the photoresponsivity of the device.

In some embodiments, in the above-mentioned PIN device, the second electrode 12 may be made of indium tin oxide (ITO), which is a transparent conductive material. The second electrode 12 which is a transparent electrode may be conducive to increasing the transmittance of optical signals and the photoresponsivity of the PIN device.

In some embodiments, the thickness of the I-type region in the above-mentioned PIN device may be 20 nm to 1 μm. In some embodiments, the thickness of the I-type region may be 50 nm, 70 nm, 100 nm, 200 nm, or 500 nm. The thickness of the I-type region may be set according to detection requirements of different optical signals, and is not limited in the embodiments. Furthermore, in a direction perpendicular to the side, which the first heavily doped region is on, of the I-type region, the width of the I-type region may be 500 nm to 1.5 μm. The width of the I-type region may specifically be 550 nm, 700 nm, 900 nm, 1.2 μm, or 1.4 μm, and is limited in the embodiments.

In some embodiments, an electrical connection structure between the TFT and the PIN device may be configured in multiple modes, such as Mode I and Mode II, as follows.

Mode I

Figure 7:
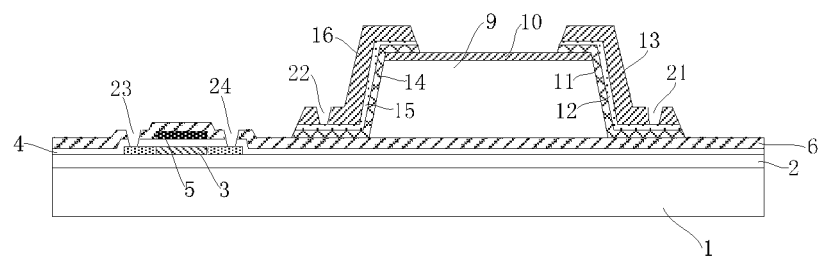

In conjunction with FIG. 7, as shown in FIG. 9, FIG. 9 is a schematic structural diagram of a photoelectric detector provided by the embodiment of the present disclosure. In the above-mentioned photoelectric detector, the TFT includes a buffer layer 2, an active layer 3, a gate insulating layer 4, a gate 5, an interlayer dielectric layer 6, a source 7, and the drain 8 that are successively stacked on the base 1. The source 7 is electrically connected to a heavily doped region 301 at one end of the active layer through a third via hole 23 running through the interlayer dielectric layer and the gate insulating layer; and the drain 8 is electrically connected to a heavily doped region 302 at the other end of the active layer through a fourth via hole 24 running through the interlayer dielectric layer and the gate insulating layer.

The I-type region 9 of the PIN device is on the interlayer dielectric layer 6, and an orthographic projection, on the base, of the I-type region 9 does not overlap with the TFT in the vertical direction. The second heavily doped region 11 is in contact connection with the side surface on the side, away from the TFT, of the I-type region 9. The upper surface of the second heavily doped region 11 is covered with the second electrode 12 with the same pattern as the second heavily doped region. The second electrode 12 is provided with a second etching barrier layer 13 which covers a top surface of the second electrode. The electrode lead wire 18 is electrically connected to the second electrode 12 through a first via hole 21 running through the second etching barrier layer. The second etching barrier layer 13 can protect the second electrode 12, and prevent the second electrode from being affected by photolithography, etching and other processes in the preparation process, thus ensuring the integrity of the second electrode and the conductivity of the second electrode.

In some embodiments, still in conjunction with FIG. 7, referring to FIG. 9, the first heavily doped region 14 is in contact connection with the side surface on the side, proximate to the TFT, of the I-type region 9. The first electrode 15 is on the upper surface of the first heavily doped region 14. The first electrode 15 is provided with a third etching barrier layer 16 which covers a top surface of the first electrode 15. A second via hole 22 is in the third barrier etch layer 16. The drain 8 of the TFT and the first electrode 15 are electrically connected by a connecting wire 17. That is, the connecting wire 17 is electrically connected to the drain 8 of the TFT and is electrically connected to the first electrode 15 through the second via hole 22 running through the third etching barrier layer.

In some embodiments, in the mode I described above, the electrode lead wire, the connecting wire, and the source and drain of the TFT are in the same layer and made of the same material. That is, the electrode lead wire, the connecting wire, and the source and drain of the TFT may be prepared on the same metal layer simultaneously by one patterning process. The connecting wire and the drain of the TFT may form a direct connection structure, that is, the connecting wire and the drain of the TFT are directly integrated, wherein a part of the connecting wire extends into the second via hole and is electrically connected to the first electrode, so that the first electrode is electrically connected to the drain of the TFT.

In the mode I described above, the second electrode may be made of ITO, which is a transparent conductive material. The second electrode which is a transparent electrode may be conducive to increasing the transmittance of optical signals and the photoresponsivity of the PIN device. The second electrode may also be made of a metal or other materials with good electric conductivity, and the material is not limited in the embodiment.

In some embodiments, as shown in FIG. 9, the photoelectric detector in the mode I described above further includes a protective layer 19 that covers the interlayer dielectric layer 6, the source 7 and the drain 8 of the TFT, the connecting wire 17, the third etching barrier layer 16, the first etching barrier layer 10, the second etching barrier layer 13 and the electrode lead wire 18. The protective layer can protect the source and the drain of the TFT, the connecting wire, the electrode lead wire and other metal traces.

In some embodiments, a planarization layer 20 with a planarization function is further on the protective layer 19 in the mode I described above.

Mode II

Figure 10:
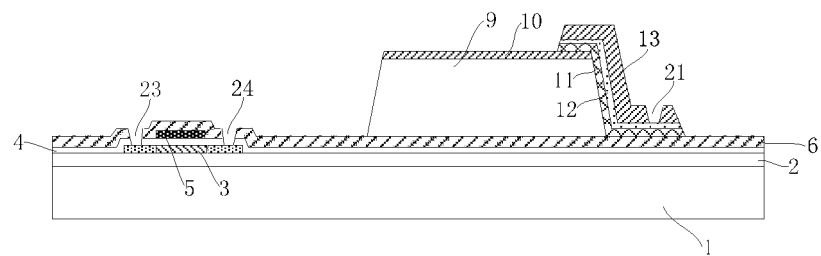
FIG. 10 to FIG. 12 are schematic diagrams of changes of film layers in a preparation process of a photoelectric detector provided by an embodiment of the present disclosure.

In conjunction with FIG. 10, as shown in FIG. 12, FIG. 12 is a schematic structural diagram of a photoelectric detector provided by the embodiment of the present disclosure. In the photoelectric detector, the TFT includes a buffer layer 2, an active layer 3, a gate insulating layer 4, a gate 5, an interlayer dielectric layer 6, a source 7, and the drain 8 that are successively stacked on the base 1. The source 7 is electrically connected to a heavily doped region 301 at one end of the active layer 3 through a third via hole 23 running through the interlayer dielectric layer 6 and the gate insulating layer 4, and the drain 8 is electrically connected to a heavily doped region 302 at the other end of the active layer through a fourth via hole 24 running through the interlayer dielectric layer and the gate insulating layer.

In some embodiments, in the mode II described above, the I-type region 9 of the PIN device is on the interlayer dielectric layer 6, and an orthographic projection, on the base, of the I-type region 9 does not overlap with the TFT in the vertical direction. The second heavily doped region 11 is in contact connection with the side surface on the side, away from the TFT, of the I-type region 9. The upper surface of the second heavily doped region 11 is covered with the second electrode 12 with the same pattern as the second heavily doped region. The second electrode 12 is provided with a second etching barrier layer 13 which covers a top surface of the second electrode 12. The electrode lead wire 18 is electrically connected to the second electrode 12 through a first via hole 21 running through the second etching barrier layer 13. The second etching barrier layer 13 can protect the second electrode 12, and prevent the second electrode from being affected by photolithography, etching and other processes in the preparation process, thus ensuring the integrity of the second electrode and the conductivity of the second electrode.

Figure 11:
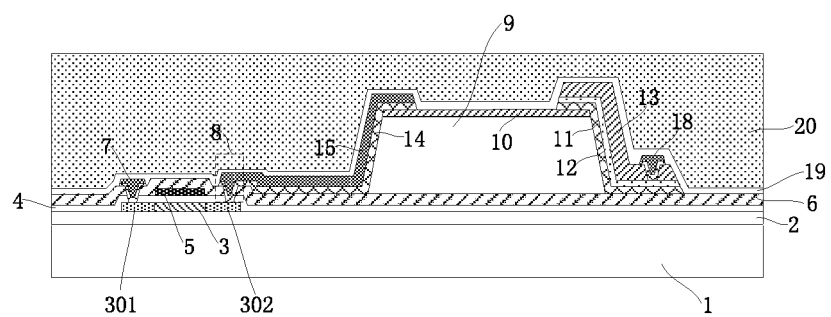

In some embodiments, in conjunction with FIG. 10, as shown in FIG. 11, in the mode II, the first heavily doped region 14 is in contact connection with the side surface on the side, proximate to the TFT, of the I-type region 9. The doping types of the first heavily doped region 14 and the heavily doped regions of the active layer 3 of the TFT are same. The first heavily doped region 14 is provided with the first electrode 15 covering the first heavily doped region 14. The first electrode 15 may be a metal electrode. Different from the mode I described above, in the mode II, the sides, toward the TFT, of the first heavily doped region 14 and the first electrode 15 extend to an area where the TFT is located, and the first heavily doped region 14 and the first electrode 15 extend into the fourth via hole 24 running through the interlayer dielectric layer and the gate insulating layer and is electrically connected to the heavily doped region 302, proximate to the I-type region 9, of the active layer 3, to serve as the drain 8 of the TFT. That is, portions of the first heavily doped region and the first electrode that extend into the fourth via hole are used as the drain of the TFT. That is, one electrode terminal of the PIN is directly integrated with the drain of the TFT, so that the connection is stable, and preparation processes may be reduced.

In the mode II described above, in conjunction with FIG. 10, as shown in FIG. 12, the source 7 of the TFT includes a double-layer structure. The source 7 of the TFT includes a first source portion, which is in the same layer as the first heavily doped region 14 and in contact connection with the heavily doped region 301 on the side, away from the I-type region 9, of the active layer 3 through the third via hole 23, and a second source portion which is on the first source portion and in the same layer as the first electrode 15. In some embodiments, the electrode lead wire 18 also includes a double-layer structure. The electrode lead wire 18 includes a first lead wire portion, which is in the same layer as the first heavily doped region 14 and in contact with the second electrode 12 through the first via hole 21, and a second lead wire portion, which is on the first lead wire portion and in the same layer as the first electrode 15. Thus, the source of the TFT and the electrode lead wire may be prepared in the same patterning process by using the same film layer as the first heavily doped region and the first electrode on the first heavily doped region, so that preparation processes are reduced.

In some embodiments, as shown in FIG. 12, the photoelectric detector in the mode II described above further includes a protective layer 19 covering the interlayer dielectric layer 6, the source 7 of the TFT, the first electrode 15, the first etching barrier layer 10, the second etching barrier layer 13 and the electrode lead wire 18, and the protective layer can protect the source of the TFT, the first electrode, and the electrode lead wire.

In some embodiments, a planarization layer 20 with a planarization function is further on the protective layer 19 in the mode II described above.

In the modes I and II described above, the interlayer dielectric layer may be made of SiO2, SiNx, or a laminate formed thereby.

Based on the same inventive concept, an embodiment of the present disclosure further provides a display panel, including a display substrate and any photoelectric detector provided by the above embodiments, wherein a base in the display substrate and a base in the photoelectric detector are the same base.

Based on the same inventive concept, an embodiment of the present disclosure further provides a display device, including any display panel provided by the above embodiments.

In addition, based on the same inventive concept, an embodiment of the present disclosure further provides a preparation method of a photoelectric detector, including:

forming a buffer layer, an active layer, a gate insulating layer and a gate successively on a base, and performing ion implantation for heavy doping on the active layer to form a heavily doped region;

forming an interlayer dielectric layer on the gate;

forming an a-Si layer and a first etching barrier film successively on the interlayer dielectric layer, and patterning the a-Si layer and the first etching barrier film by the same patterning process to form an I-type region and a first etching barrier layer covering a top surface of the I-type region;

forming a second heavily doped layer, a second electrode layer and a second etching barrier film are successively on the first etching barrier layer, and patterning the second heavily doped layer, the second electrode layer and the second etching barrier film by the same patterning process to form a second heavily doped region, a second electrode and a second etching barrier layer stacked successively on a side, away from the TFT, of the I-type region;

forming a first heavily doped layer and a first electrode layer successively on the second etching barrier layer, and patterning the first heavily doped layer and the first electrode layer by the same patterning process to form a first heavily doped region and a first electrode stacked successively on a side, proximate to the TFT, of the I-type region; and forming a source and a drain electrically connected to the first electrode on the interlayer dielectric layer, and forming an electrode lead wire electrically connected to the second electrode on the second etching barrier layer at the same time.

In the photoelectric detector prepared by the above-mentioned preparation method, the PIN device is of the horizontal structure, and the first heavily doped region and the second heavily doped region are respectively on two opposite sides of the periphery of the I-type region, so that the number and thickness of film layers on a light incident side of the PIN device are effectively reduced, thereby reducing the reflection and absorption of optical signals by the film layers, increasing the transmittance of the optical signals, and improving the photoresponsivity of the device. During the preparation, the same patterning process is used for preparation in the case of patterning of a plurality of film layers, so that the number of mask processes is reduced, and the preparation process is simplified.

In some embodiments, the configuration of the connection structure between the TFT and the PIN device is selected from multiple modes, and the corresponding preparation method is also selected correspondingly from multiple modes, and specifically, the preparation modes, such as preparation mode I and preparation mode II, are as follows:

Preparation Mode I

Figure 1:
FIG. 1 to FIG. 9 are schematic diagrams of structural changes of film layers in a preparation process of a photoelectric detector provided by an embodiment of the present disclosure.

As shown in FIG. 1, a step S101 is to form a buffer layer 2 on the base 1, form an a-Si layer on the buffer layer 2, transform the a-Si layer into a p-Si layer by an excimer laser annealing (ELA) technology, and pattern the p-Si layer by a patterning process, that is the first mask, to form an active layer 3.

Figure 2:
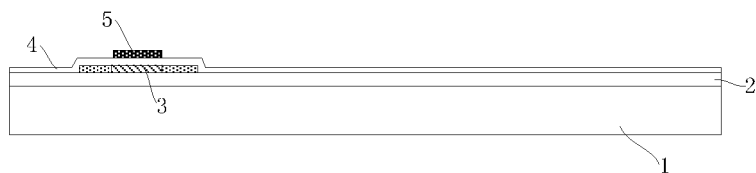

As shown in FIG. 2, a step S102 is to form a gate insulating layer 4 on the active layer 3, form a gate metal layer on the gate insulating layer 4, and pattern the gate metal layer by a patterning process, that is the second mask, to form a gate 5, and dope the active layer heavily by ion implantation to form a channel region and heavily doped regions respectively on two sides of the channel region after the gate 5 is formed.

Figure 3:
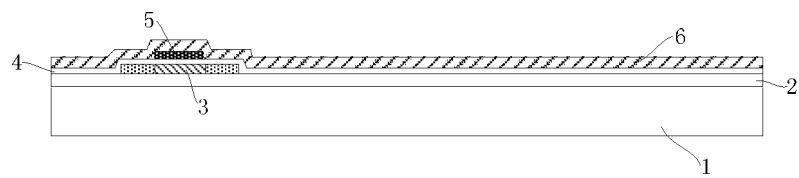

As shown in FIG. 3, a step S103 is to form an interlayer dielectric layer 6 on the gate.

Figure 4:
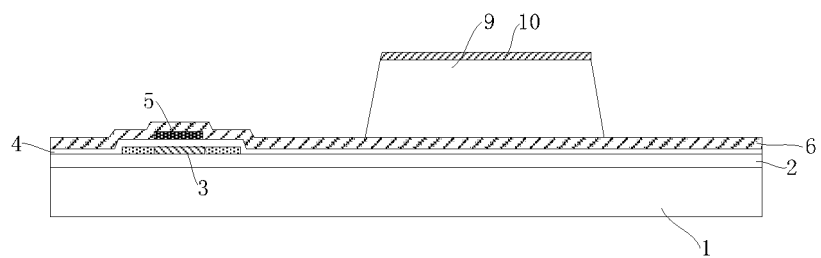

As shown in FIG. 4, a step S104 is to prepare the structure of a PIN device, after the interlayer dielectric layer 6 is formed. Specifically, the step S104 is to form an a-Si layer on the interlayer dielectric layer 6, form a first etching barrier film on the a-Si layer, and pattern the a-Si layer and the first etching barrier film by the same patterning process, that is the third mask, to form an I-type region 9 and a first etching barrier layer 10 covering a top surface of the I-type region. Wherein the first etching barrier layer can protect the I-type region in the etching process.

Figure 5:
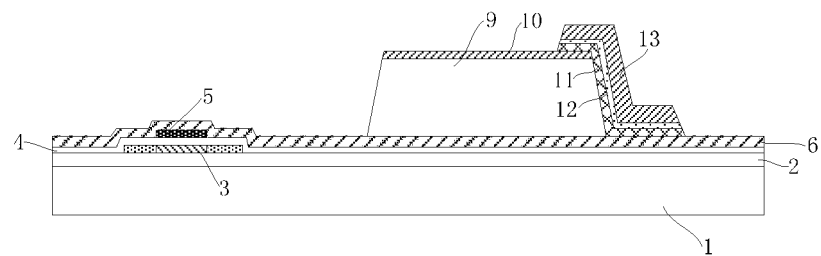

As shown in FIG. 5, a step S105 is to form a second heavily doped layer, a second electrode layer and a second interlayer dielectric film successively on the interlayer dielectric layer 6, the I-type region 9 and the first etching barrier layer 10, and pattern the second heavily doped layer, the second electrode layer and the second interlayer dielec-tric film by the same patterning process, that is the fourth mask, to form a second heavily doped region 11, a second electrode 12 and a second etching barrier layer 13 that are successively stacked on a side, away from the TFT, of the I-type region 9. Wherein the second heavily doped region 11 covers and is in contact with a side surface on the side, away from the TFT, of the I-type region 9.

Figure 6:
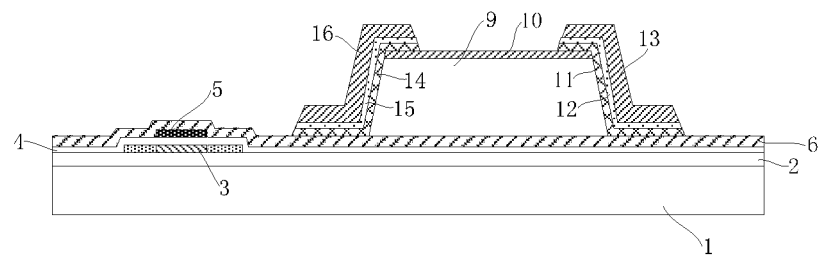

As shown in FIG. 6, a step S106 is to form a first heavily doped layer, a first electrode layer and a third interlayer dielectric film successively on the interlayer dielectric layer 6, the I-type region 9, the first etching barrier layer 10 and the second etching barrier layer 13, and pattern the first heavily doped layer, the first electrode layer and the third interlayer dielectric film by the same patterning process, that is the fifth mask, to form a first heavily doped region 14, a first electrode 15 and a third etching barrier layer 16 that are successively stacked on a side, proximate to the TFT, of the I-type region 9. Wherein the first heavily doped region 14 covers and is in contact with a side surface on the side, proximate to the TFT, of the I-type region 9.

As shown in FIG. 7, a step S107 to form a fourth via hole 24 corresponding to a heavily doped region, proximate to the I-type region 9, of the active layer 3 and a third via hole 23 corresponding to a heavily doped region, away from the I-type region 9, of the active layer 3 in the interlayer dielectric layer 6 and the gate insulating layer 4 by the same patterning process, that is the sixth mask, form a first via hole 21 in the second etching barrier layer 13, and form a second via hole 22 in the third etching barrier layer 16.

Figure 8:
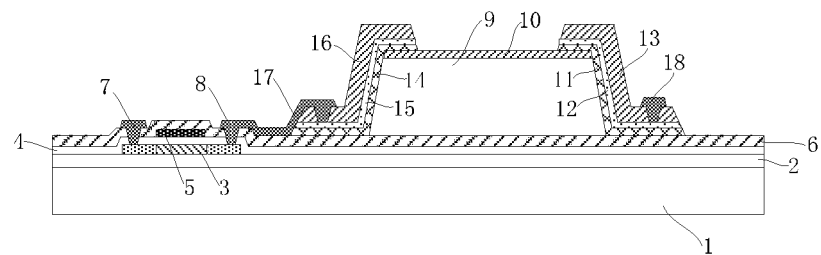

In conjunction with FIG. 7, as shown in FIG. 8, a step S108 is to deposit a metal on the interlayer dielectric layer, the first etching barrier layer, the second etching barrier layer and the third etching barrier layer to form a metal layer, and pattern the metal layer by a patterning process, that is the seventh mask, to form a source 7 electrically connected to a heavily doped region at one end of the active layer 3 through the third via hole 23, a drain 8 electrically connected to a heavily doped region at the other end of the active layer 3 through the fourth via hole 24, a connecting wire 17 electrically connected to the drain 8 and electrically connected to the first electrode 15 through the second via hole 22, and an electrode lead wire 18 electrically connected to the second electrode 12 through the first via hole 21.

As shown in FIG. 9, a step S109 is to form a protective layer 19 on the interlayer dielectric layer 6, the first etching barrier layer 10, the second etching barrier layer 13, the third etching barrier layer 16, the source 7 and the drain 8 of the TFT, and the electrode lead wire 18, and form a planarization layer 20 on the protective layer.

In the preparation method of the preparation mode I described above, masking is carried out seven times to accomplish the preparation of the photoelectric detector, thereby effectively simplifying the preparation process of the photoelectric detector compared with the related art. As the PIN device is of a horizontal structure, side walls are not exposed in the subsequent preparation after the preparation of the I-type region is completed. So there is no need to deposit a side wall protective layer, thereby further reducing preparation processes compared with the related art. In addition, it should be noted that in the preparation mode I described above, the sequence of the steps S105 and S106 may be reversed, that is, the first heavily doped region, the first electrode and the second etching barrier layer may be prepared first, and then the second heavily doped region, the second electrode and the third etching barrier layer are prepared, without influencing the overall structure of the formed photoelectric detector.

Preparation Mode II

As shown in FIG. 1, a step S201 to form a buffer layer 2 on the base 1, form an a-Si layer on the buffer layer 2, transform the a-Si layer into a p-Si layer by an excimer laser annealing (ELA) technology, and pattern the p-Si layer by a patterning process, that is the first mask, to form an active layer 3.

As shown in FIG. 2, a step S202 is to form a gate insulating layer 4 on the active layer 3, form a gate metal layer on the gate insulating layer 4, and pattern the gate metal layer by a patterning process, that is the second mask, to form a gate 5, and dope the active layer heavily by ion implantation to form a channel region and heavily doped regions respectively on two sides of the channel region after the gate 5 is formed.

As shown in FIG. 3, a step S203 is to form an interlayer dielectric layer 6 on the gate 5.

As shown in FIG. 4, a step S204 is to prepare the structure of a PIN device, after the interlayer dielectric layer 6 is formed. Specifically, the step S204 is to form an a-Si layer on the interlayer dielectric layer 6, form a first etching barrier film on the a-Si layer, and pattern the a-Si layer and the first etching barrier film by the same patterning process, that is the third mask, to form an I-type region 9 and a first etching barrier layer 10 covering a top surface of the I-type region 9. Wherein the first etching barrier layer can protect the I-type region in the etching process.

As shown in FIG. 5, a step S205 is to form a second heavily doped layer, a second electrode layer and a second interlayer dielectric film successively on the interlayer dielectric layer 6, the I-type region 9 and the first etching barrier layer 10, and pattern the second heavily doped layer, the second electrode layer and the second interlayer dielectric film by the same patterning process, that is the fourth mask, to form a second heavily doped region 11, a second electrode 12 and a second etching barrier layer 13 that are successively stacked on a side, away from the TFT, of the I-type region 9. Wherein the second heavily doped region 11 covers and is in contact connection with a side surface on the side, away from the TFT, of the I-type region 9.

In the preparation mode II, the method for preparing the active layer, the gate, the I-type region, and the second heavily doped region, the second electrode and the second etching barrier layer on the side, away from the TFT, of the I-type region may be same as the preparing method in the preparation mode I described above, and differs in the subsequent preparation mode after the preparation of the second heavily doped region, the second electrode and the second etching barrier layer is completed. In some embodiments, as shown in FIG. 10, a step S206 is to form a fourth via hole 24 corresponding to a heavily doped region, proximate to the I-type region 9, of the active layer 3, and a third via hole 23 corresponding to a heavily doped region, away from the I-type region, of the active layer 3 in the interlayer dielectric layer 6 and the gate insulating layer 4 by the same patterning process, that is the fifth mask, and to form a second via hole 22 in the third etching barrier layer 13.

In conjunction with FIG. 10, as shown in FIG. 11, a step S207 is to form a first heavily doped layer of the same doping type as the heavily doped regions of the active layer 3, and a metal layer successively on the interlayer dielectric layer 6, the I-type region 9, the first etching barrier layer 10 and the second etching barrier layer 13, and pattern the first heavily doped layer and the metal layer by the same patterning process, that is the sixth mask, to form a first heavily doped region 14 in contact with a side surface on the side, proximate to the TFT, of the I-type region 9, a second electrode 12 covering the first heavily doped region, a source 7 partly in the third via hole and electrically connected to the heavily doped region, away from the I-type region, of the active layer, and an electrode lead wire 18 partly in the first via hole and in contact connection with the first electrode. Wherein the first heavily doped region 14 and the first electrode 15 extend to an area where the TFT is located, and extend into the fourth via hole 24 and is electrically connected to the heavily doped region, proximate to the I-type region 9, of the active layer 3 through the fourth via hole 24, to serve as the drain 8 of the TFT. That is, an electrode terminal at one end of the PIN device and the drain of the TFT is prepared into an integrated pattern structure, and the source 7 of the TFT and the electrode lead wire 18 are also double-layer structures.

As shown in FIG. 12, a step S208 is to form a protective layer 19 is on the interlayer dielectric layer 6, the first etching barrier layer 10, the second etching barrier layer 13, the source 7 of the TFT, the second electrode 12 and the electrode lead wire 18, and form a planarization layer 20 on the protective layer.

In the preparation method of the preparation mode II described above, masking is carried out six times to accomplish the preparation of the photoelectric detector, thereby effectively simplifying the preparation process of the photoelectric detector compared with the related art. As the PIN device is of a horizontal structure, side walls are not exposed in the subsequent preparation n after the preparation of the I-type region is completed. So there is no need to deposit a side wall protective layer, thereby further reducing preparation processes compared with the related art.

Evidently those skilled in the art can make various modifications and variations to the embodiments of the present disclosure without departing from the spirit and scope of the present disclosure. Thus, the present disclosure is also intended to encompass the modifications and variations so long as the modifications and variations to the present disclosure fall within the scope of the claims appended to the present disclosure and their equivalents.

What is claimed is:

1. A photoelectric detector, comprising a base, a thin film transistor (TFT) on the base, and a photosensitive PIN device on the base, wherein the PIN device comprises:
   an I-type region, wherein an orthographic projection, on the base, of the I-type region does not overlap with an orthographic projection, on the base, of the TFT;
   a first etching barrier layer, covering a top surface of the I-type region;
   a first heavily doped region, in contact with a side surface on a side, proximate to the TFT, of the I-type region;
   a second heavily doped region, in contact with a side surface on a side, away from the TFT, of the I-type region; wherein a doping type of the first heavily doped region is different from a doping type of the second heavily doped region;
   a first electrode, covering a top surface of the first heavily doped region; wherein the first electrode is electrically connected to a drain of the TFT;
   a second electrode, covering a top surface of the second heavily doped region; wherein the second electrode is electrically connected to an electrode lead wire; and
   a second etching barrier layer, covering a top surface of the second electrode; wherein the electrode lead wire is electrically connected to the second electrode through a first via hole that runs through the second etching barrier layer.

2. The photoelectric detector according to claim 1, wherein the PIN device further comprises:
a third etching barrier layer, covering a top surface of the first electrode; wherein a connecting wire electrically connected with the drain of the TFT is electrically connected to the first electrode through a second via hole that runs through the third etching barrier layer.

3. The photoelectric detector according to claim 2, wherein the electrode lead wire, the connecting wire, a source of the TFT, and the drain of the TFT are in a same layer and made of a same material.

4. The photoelectric detector according to claim 3, wherein the TFT comprises:
a buffer layer, an active layer, a gate insulating layer, a gate, an interlayer dielectric layer, the source and the drain that are successively stacked on the base; wherein the source is electrically connected to a heavily doped region at one end of the active layer through a third via hole that runs through the interlayer dielectric layer and the gate insulating layer, and the drain is electrically connected to a heavily doped region at the other end of the active layer through a fourth via hole that runs through the interlayer dielectric layer and the gate insulating layer.

5. The photoelectric detector according to claim 4, wherein the doping type of the first heavily doped region and a doping type of heavily doped regions of the active layer of the TFT are same.

6. The photoelectric detector according to claim 5, wherein the first heavily doped region and the first electrode extend to an area where the TFT is located to serve as the drain of the TFT.

7. The photoelectric detector according to claim 5, wherein the electrode lead wire comprises a first lead wire portion in a same layer as the first heavily doped region and in contact with the second electrode through the first via hole, and a second lead wire portion on the first lead wire portion and in a same layer as the first electrode.

8. The photoelectric detector according to claim 6, wherein the electrode lead wire comprises a first lead wire portion in a same layer as the first heavily doped region and in contact with the second electrode through the first via hole, and a second lead wire portion on the first lead wire portion and in a same layer as the first electrode.

9. A display panel, comprising: a display substrate and the photoelectric detector according to claim 1, wherein a base in the display substrate and the base in the photoelectric detector are a same base.

10. A display device, comprising the display panel according to claim 9.

11. A preparation method of the photoelectric detector according to claim 1, comprising:
forming a buffer layer, an active layer, a gate insulating layer and a gate successively on the base;
performing ion implantation for heavy doping on the active layer to form a heavily doped region;
forming an interlayer dielectric layer on the gate;
forming an a-Si layer and a first etching barrier film successively on the interlayer dielectric layer;
patterning the a-Si layer and the first etching barrier film by a same patterning process to form the I-type region and the first etching barrier layer covering the top surface of the I-type region;
forming a second heavily doped layer, a second electrode layer and a second etching barrier film successively on the first etching barrier layer;
patterning the second heavily doped layer, the second electrode layer and the second etching barrier film by a same patterning process to form the second heavily doped region, the second electrode and a second etching barrier layer stacked successively on the side, away from the TFT, of the I-type region;
forming a first heavily doped layer and a first electrode layer successively on the second etching barrier layer;
patterning the first heavily doped layer and the first electrode layer by a same patterning process to form the first heavily doped region and the first electrode stacked successively on the side, proximate to the TFT, of the I-type region; and
forming a source, and the drain electrically connected to the first electrode on the interlayer dielectric layer, and forming the electrode lead wire electrically connected to the second electrode on the second etching barrier layer while forming the source and the drain.

12. The preparation method according to claim 11, further comprising:
forming a third etching barrier film on the first electrode layer; and
patterning the first heavily doped layer, the first electrode layer and the third etching barrier film by a same patterning process to form the first heavily doped region, the first electrode and the third etching barrier layer stacked successively on the side, proximate to the TFT, of the I-type region.

13. The preparation method according to claim 12, further comprising:
patterning the second etching barrier layer, the third etching barrier layer, the interlayer dielectric layer and the gate insulating layer by a same patterning process to form a first via hole running through the second etching barrier layer, a second via hole running through the third etching barrier layer, and a third via hole and a fourth via hole running through the interlayer dielectric layer and the gate insulating layer, before forming the source, and the drain electrically connected to the first electrode on the interlayer dielectric layer.

14. The manufacturing method according to claim 11, further comprising:
patterning the second etching barrier layer, the interlayer dielectric layer and the gate insulating layer by a same patterning process to form a first via hole running through the second etching barrier layer, and a third via hole and a fourth via hole running through the interlayer dielectric layer and the gate insulating layer, before forming a first heavily doped layer and a first electrode layer successively on the second etching barrier layer.

15. The preparation method according to claim 14, wherein the forming the source, and the drain electrically connected to the first electrode on the interlayer dielectric layer, and forming an electrode lead wire electrically connected to the second electrode on the second etching barrier layer while forming the source and the drain comprises:
patterning the first heavily doped layer and the first electrode layer by a same patterning process to form the first heavily doped region and the first electrode stacked successively on the side, proximate to the TFT, of the I-type region; and
forming the electrode lead wire at the first via hole, forming the source at the third via hole, and forming the drain at the fourth via hole, while patterning the first heavily doped layer and the first electrode layer.

* * * * *